US009961727B2

(12) United States Patent
Vanderzon

(10) Patent No.: US 9,961,727 B2
(45) Date of Patent: May 1, 2018

(54) PHASE CONTROL DIMMER CIRCUIT

(71) Applicant: GERARD LIGHTING HOLDINGS PTY LTD, South Australia (AU)

(72) Inventor: James Vanderzon, MacDonald Park (AU)

(73) Assignee: Ozuno Holdings Limited, Road Town, Tortola (VG)

( * ) Notice: Subject to any disclaimer, the term of this patent is extended or adjusted under 35 U.S.C. 154(b) by 0 days. days.

(21) Appl. No.: 15/313,075

(22) PCT Filed: May 20, 2015

(86) PCT No.: PCT/AU2015/000297
§ 371 (c)(1),
(2) Date: Nov. 21, 2016

(87) PCT Pub. No.: WO2015/176110
PCT Pub. Date: Nov. 26, 2015

(65) Prior Publication Data
US 2017/0231038 A1 Aug. 10, 2017

(30) Foreign Application Priority Data
May 22, 2014 (AU) ................. 2014901923

(51) Int. Cl.
H05B 37/02 (2006.01)
H05B 33/08 (2006.01)
(52) U.S. Cl.
CPC ..... *H05B 33/0815* (2013.01); *H05B 33/0845* (2013.01)
(58) Field of Classification Search
CPC ............ H05B 33/0815; H05B 33/0845; H03K 17/166; H02M 1/88
(Continued)

(56) References Cited

U.S. PATENT DOCUMENTS 4,319,318 A * 3/1982 Rippel ................. H02M 1/088
327/458
4,540,892 A 9/1985 Bloomer
(Continued)

FOREIGN PATENT DOCUMENTS

WO WO 2015/176110 11/2015

OTHER PUBLICATIONS

International Search Report and Written Opinion of International Patent Application No. PCT/AU2015/000297, filed May 20, 2015. 8 pages.

*Primary Examiner* — Don Le
(74) *Attorney, Agent, or Firm* — Fish & Richardson P.C.

(57) ABSTRACT

A trailing edge phase control dimmer circuit for controlling alternating current (AC) power to a load, the circuit including: a switching circuit for controlling delivery of AC power to the load by conducting power to the load in an ON state and not conducting power to the load in an OFF state; and a switching control circuit for controlling turn-OFF and turn-ON of the switching circuit at each cycle of the AC to control switching of the ON and OFF states of the switching circuit, wherein the switching control circuit controlling turn-OFF of the switching circuit includes controlling a turn-OFF transition of the switching circuit between the ON state and the OFF state of the switching circuit extending for a selected turn-OFF transition time, and wherein the switching control circuit further includes a dv/dt feedback circuit for controlling a turn-OFF transition profile indicative of a drain voltage of the switching circuit of the turn-OFF transition and the selected turn-OFF transition time by returning at least some dv/dt feedback current generated by the switching circuit back to the switching circuit, whereby the dv/dt feedback circuit is configured to control said at least some dv/dt feedback current over the turn-OFF transition so as to reduce a rate of change of at least an initial (Continued)

region of the turn-OFF transition profile to minimize harmonics generation by the switching circuit.

11 Claims, 4 Drawing Sheets

(58) Field of Classification Search
 USPC .................................................. 315/209 R
 See application file for complete search history.

(56) References Cited

U.S. PATENT DOCUMENTS

| | | | |
|---|---|---|---|
| 4,540,893 A * | 9/1985 | Bloomer | H03K 17/04126 327/170 |
| 4,633,161 A | 12/1986 | Callahan et al. | |
| 5,424,618 A | 6/1995 | Bertenshaw et al. | |
| 2012/0230076 A1* | 9/2012 | Palmer | H03K 17/0828 363/132 |
| 2014/0139268 A1* | 5/2014 | Bayerer | H03K 17/063 327/109 |
| 2014/0375362 A1* | 12/2014 | Lobsiger | H03K 17/00 327/109 |

* cited by examiner (PRIOR ART)          (PRIOR ART)

PHASE CONTROL DIMMER CIRCUIT

TECHNICAL FIELD

The present invention relates to a phase control dimmer circuit for controlling alternating current (AC) power to a load.

In particular, but not exclusively, the present invention relates to a trailing edge phase control dimmer circuit having a MOSFET switching circuit for controlling a capacitive load, such as a driver for LED lights.

BACKGROUND OF INVENTION

Dimmer circuits are commonly used to control power, in particular alternating current (AC) mains power, to a load, such as a light source. In one existing method, a light source can be dimmed using phase controlled dimming whereby power provided to the load is controlled by varying the amount of time that a switch connecting the load to a mains power source is conducting during a cycle of the AC (i.e. varying the duty time). Specifically, AC power to the load is switched ON and OFF during each half cycle of alternating current and the amount of dimming of the load is provided by the amount of ON time in relation to the OFF time for each half cycle.

Phase control dimmer circuits generally operate as trailing edge or leading edge dimmer circuits, and the two circuits are suited to different applications. In leading edge circuits, power is switched OFF at the beginning of each half cycle. In trailing edge circuits, power is switched OFF later in each half cycle (e.g. towards the end of each half cycle). Leading edge dimmer circuits are generally better suited to controlling power to inductive loads, such as small fan motors and iron core low voltage lighting transformers. Trailing edge dimmer circuits, on the other hand, are generally better suited to controlling power to capacitive loads, such as drivers for Light Emitting Diode (LED) lights.

Phase control dimmer circuits, however, can produce conducted harmonics causing electromagnetic interference (EMI) emissions when switching ON and OFF power to the load. Accordingly, existing exemplary phase control dimmer circuits have been configured to produce a more gradual transition between conducting and non-conducting states of the switching circuit to minimise these EMI emissions. For example, in an existing trailing edge dimmer circuit, the turn-OFF transition time of the switch for each half cycle is increased so that power is switched OFF more gradually to the load to reduce the magnitude of associated radio frequency (RF) harmonics produced causing EMI emissions, and thus to minimise line conducted EMI emissions. In trailing edge dimmer circuits, switching OFF of the switching circuit provides greater EMI emissions than switching ON, as switching ON is performed at the zero crossing of the AC. Also, it will be appreciated by those persons skilled in the art that the switching OFF of the switch is performed over a turn-OFF transition time and the switching ON of the switch is performed over a turn-ON transition time. It will be appreciated by those persons skilled in the art that, in an ideal trailing edge dimmer, turn-ON at the zero crossing of the AC implies no associated transition time Indeed, dimmers with the above-mentioned trailing edge dimmer circuitry are currently sold in many countries that comply with certain regulatory standards for electromagnetic compatibility (EMC) and EMI. Nonetheless, the above mentioned gradual switching OFF of power to the load over an increased turn-OFF transition time results in additional power dissipation for the dimmer circuit switching device. This additional power is generally dissipated as heat by the switching device which can be detrimental to the operation and lifespan of a dimmer employing such a dimmer circuit. Additionally, increased switching losses reduce the achievable maximum load capacity of the dimmer.

Examples of a prior art trailing edge phase control dimmer circuits are shown in FIGS. 1 and 2. Specifically, FIG. 1 shows a prior art trailing edge phase control dimmer circuit 10 with a switching circuit 12 for controlling delivery of AC power to a load (e.g. switching ON and OFF) and a switching control circuit 14 for controlling switching of the switching circuit 12. FIG. 2 shows another prior art trailing edge phase control dimmer circuit 16 with a switching control circuit 18 for controlling switching of the switching circuit 12. The switching control circuit 18 of FIG. 2 also includes the addition of a dv/dt feedback circuit 20 for further controlling switching of the switching circuit 12.

The switching circuit 12, as shown in FIGS. 1 and 2, includes switching elements Q4 and Q5, which are MOSFET switching devices. Specifically, the MOSFETs Q4 and Q5 are high voltage (600V) N-channel MOSFETs (e.g. FCPF11N60), which are used to control the amount of power delivered to the load. The MOSFETs Q4 and Q5 are configured so that they alternately control power delivery to the load over the different polarity half cycles of AC power. That is, the MOSFETs Q4 and Q5 turn-ON and turn-OFF the switching circuit 12 at each cycle of the AC, respectively, so that the load (e.g. a driver for LED down lights) is dimmed in proportion to the amount of time in each cycle that the switching circuit 12 is switched OFF.

The switching control circuit 14 of FIG. 1 and the switching control circuit 18 of FIG. 2 provide gate drive control of the MOSFETs Q4 and Q5. In these examples, the switching control circuits 14 18 exploit a MOSFET's inherent characteristic "Miller Effect" capacitance to control the overall switching time to switch OFF the MOSFETs Q4 and Q5—that is, to control the turn-OFF transition time of the MOSFETs Q4 and Q5. Typical power MOSFETs, like the exemplary power MOSFETs FCPF11N60, that are suitable for trailing edge dimmer circuits, exhibit less than optimum drain-gate capacitance versus drain voltage characteristics which results in a somewhat pronounced non-linearity of provided drain current over a turn-OFF transition due to the rapid fall in the capacitance.

It will be appreciated by those persons skilled in the art that the turn-OFF transition occurs over a time taken to switch OFF, for instance, the MOSFETs Q4 and Q5, hereinafter referred to as "turn-OFF transition time". It will also be appreciated that, over the turn-OFF transition, the change in MOSFET drain voltage provided by, for instance, the MOSFETs Q4 and Q5 is hereinafter referred to as a "turn-OFF transition profile".

In order to achieve a low harmonic content and minimise EMI emissions, the rate of change of the slope of the turn-OFF transition profile is to be minimised over the turn-OFF transition. In doing so, however, a longer than optimum overall turn-OFF transition time for power dissipation is typically employed—as provided by the exemplary circuits shown in FIGS. 1 and 2—to ensure that trailing edge phase control dimmer circuits comply with line conducted EMI limits.

The exemplary switching control circuit 14 of FIG. 1, and also the switching control circuit 18 of FIG. 2, implements MOSFET gate drive control using transistors Q1 and Q2. In the examples shown, the transistors Q1 and Q2 are BC856 PNP transistors. Transistor Q1 base drive at resistor R1 input is pulled high to charge MOSFET gate capacitance of the MOSFETs Q4 and Q5 via resistor R2 to hold the MOSFETs Q4 and Q5 in the ON state condition. In the exemplary circuit of FIG. 1, R1 is a 100KΩ resistor and R2 is a 1KΩ resistor. Diode D1 and Zener diode ZD1 are employed to clamp the MOSFETs Q4 and Q5 ON state gate voltage at a suitable level for proper bias. In the examples of FIGS. 1 and 2, D1 is a 4148 high speed diode and ZD1 is a 7V5 Zener diode. Transistor Q2 base drive at R1 input is pulled low to cause discharge of MOSFET gate capacitance via resistor R3, which is of a value that is selected to provide the desired turn-OFF transition time of the MOSFETs Q4 and Q5. R3 is selected as a 56KΩ resistor in the switching control circuit 14 of FIG. 1 to, for example, provide the required turn-OFF transition time of the MOSFETs Q4 and Q5 to comply with EMI requirements.

The turn-OFF transition time provided by the switching control circuit 14 of FIG. 1 is relatively slow using the 56KΩ resistor R3, and is shown in FIG. 4 in a display 40 of an oscilloscope analysing operation of the dimmer circuit 10. As discussed, the relatively slow turn-OFF transition time results in high transition related power dissipation. The display 40 of FIG. 4 shows the load current 42 with 0.5 A per division and MOSFET Q4 and Q5 gate voltage 44 with 2V per division. It will be appreciated by those persons skilled in the art that the load current is indicative of the switching circuit drain voltage when the load has certain impedance characteristics. Specifically, in this example, the load is a resistive load type (e.g. incandescent lamp) so that the load current 42 shown is indicative of the MOSFET Q4 and Q5 drain voltage.

In FIG. 4, it can be seen that the load current 42—indicative of the drain current—is transitioned from the ON to OFF state by the switching control circuit 14 over a turn-OFF transition time of approximately 75 μs. It can also be seen that the load current 42 over the turn-OFF transition forms a curve having a non-linear slope that indicates the turn-OFF transition profile of the dimmer circuit 10 of the prior art circuit exemplified in FIG. 1.

In the exemplary circuit of FIG. 2, the switching control circuit 18 is configured to reduce the turn-OFF transition time by selecting a 22KΩ resistor as R3. It will be appreciated by those persons skilled in the art that turn-OFF transition time can be shortened to reduce transition related power dissipation, but this generally requires a sharper initial turn-OFF and/or a sharper final turn-OFF region of the turn-OFF transition profile which can result in excessive EMI causing harmonics output.

The turn-OFF transition provided by the switching control circuit 14 with a 22KΩ R3 resistor is indicated in FIG. 5 as a display 46 of an oscilloscope analysing operation of this dimmer circuit. The display 46 also shows load current 48 with 0.5 A per division and MOSFET Q4 and Q5 gate voltage 50 with 2V per division. Here, it can be seen that the load current 48 is transitioned from the ON to OFF state over a relatively short turn-OFF transition time of approximately 50 μs. Again, the load current 48 is indicative of the MOSFET Q4 and Q5 drain voltage due to the resistive load being employed for this example. To achieve the relatively short turn-OFF transition time, however, excessive EMI harmonic output is generated by the increased sharpness of the initial/final turn-OFF regions of the turn-OFF transition profile in comparison to the turn-OFF transition profile provided by the switching circuit 14 with a 56KΩ R3 resistor.

Accordingly, existing examples of prior art dimmer circuits have been developed to smooth the initial/final turn-OFF regions of the turn-OFF transition profile to reduce EMI causing harmonics generation of the switching circuit. For example, the switching control circuit 18 of FIG. 2 has a dv/dt feedback circuit 20 to attempt to smooth the initial/final turn-OFF regions of the turn-OFF transition profile to reduce harmonics generation. It will be appreciated by those persons skilled in the art that dv/dt refers to the difference in voltage with respect to the differential in time across the switching element, such as MOSFETs Q4 and Q5.

The dv/dt feedback circuit 20 of FIG. 2 includes a basic drain voltage dv/dt feedback mechanism to reduce the rate of change of the initial/final turn-OFF regions of the turn-OFF transition profile achieved by the switching control circuit 18 having the 22KΩ R3 resistor. The additional operation of the dv/dt feedback circuit 20 of FIG. 2, however, while smoothing the initial/final turn-OFF regions of the turn-OFF transition profile, increases the turn-OFF transition time which causes high associated transition power dissipation of the dimmer circuit 16.

The exemplary turn-OFF transition profile following deployment of the dv/dt feedback circuit 20 of FIG. 2 is indicated in FIG. 6 in a display 52 of an oscilloscope analysing operation of the dimmer circuit 16 with the dv/dt feedback circuit 20. Specifically, the display 52 shows load current 54 with 0.5 A per division and MOSFET Q4 and Q5 gate voltage 56 with 2V per division. Again, in this example, the load current 48 is indicative of the MOSFET Q4 and Q5 drain voltage. Here, it can be seen, however, that, while the initial/final regions of the turn-OFF transition profile are smoother with a more gradual rate of change of slope of the turn-OFF transition profile, the load current 42 is transitioned from the ON to OFF state over a relatively long turn-OFF transition time of approximately 125 μs. In addition, the display 52 shows the dv/dt feedback current 58 with 200 μA per division that is fed to the gate of the MOSFETs Q4 and Q5 of the switching circuit 12.

The dv/dt feedback circuit 20 of FIG. 2 therefore merely employs a basic drain voltage dv/dt feedback mechanism by returning dv/dt feedback current through capacitor C1 with a capacitance that exceeds that required to generate sufficient voltage across resistor R4 to result in operation of transistor Q3 in directing excess dv/dt feedback current to the MOSFETs Q4 and Q5 gate terminal. Since the configuration of the transistor Q3 does not offer any current gain, the regulated dv/dt outcome will remain higher than given by the equation:

$$dv/dt(\text{min}) = Vbe(Q3)/(R4 \times C1).$$

In the example in FIG. 2, the transistor Q3 is also a BC856 PNP transistor, the capacitor C1 is a 100 pF capacitor, and the resistor R4 is a 3.3KΩ. With reference to the above equation, for example, dv/dt (min)=0.5V/(3.3KΩ×100 pF)=1.5V/μs. Accordingly, in this example, dv/dt corresponds to a transition time of 225 μs at the middle of a half cycle instantaneous voltage of 340V.

Accordingly, the addition of the dv/dt feedback circuit 20 of FIG. 2 to the dimmer circuit 16 still fails to minimise transition power related dissipation which affects the performance and longevity of a dimmer employing the dimmer circuit 16 of FIG. 2.

SUMMARY OF INVENTION

Accordingly, in one aspect of the present invention, there is provided a trailing edge phase control dimmer circuit for controlling alternating current (AC) power to a load, the circuit including: a switching circuit for controlling delivery of AC power to the load by conducting power to the load in an ON state and not conducting power to the load in an OFF state; and a switching control circuit for controlling turn-OFF and turn-ON of the switching circuit at each cycle of the AC to control switching of the ON and OFF states of the switching circuit, wherein the switching control circuit controlling turn-OFF of the switching circuit includes controlling a turn-OFF transition of the switching circuit between the ON state and the OFF state of the switching circuit extending for a selected turn-OFF transition time, and wherein the switching control circuit further includes a dv/dt feedback circuit for controlling a turn-OFF transition profile indicative of a drain voltage of the switching circuit of the turn-OFF transition and the selected turn-OFF transition time by returning at least some dv/dt feedback current generated by the switching circuit back to the switching circuit, whereby the dv/dt feedback circuit is configured to control said at least some dv/dt feedback current over the turn-OFF transition so as to reduce a rate of change of at least an initial region of the turn-OFF transition profile to minimise harmonics generation by the switching circuit.

As discussed, the turn-OFF transition profile indicates a drain voltage waveform provided by the switching circuit, which extends for the selected turn-OFF transition time over the turn-OFF transition. Further, it will be appreciated by those persons skilled in the art that the change in drain voltage over the turn-OFF transition from the switching circuit is not linear and typically the rate of change of the slope of the voltage over the turn-OFF transition is greater in the initial and final regions of the turn-OFF transition. The turn-OFF transition profile for trailing edge phase control dimmers therefore resembles a reverse "S" curve (as opposed to a turn-ON transition "S" curve associated with phase control leading edge dimmers).

In an embodiment, the switching circuit includes two MOSFETs to control turn-OFF and turn-ON at each half cycle of the AC respectively, and wherein the switching control circuit provides gate drive control of the MOSFETs to control the turn-OFF transition of the MOSFETs. In other embodiments, the switching circuit includes other switching devices such as other Field-effect transistors to control turn-OFF and turn-ON at each half cycle of the AC.

In the embodiment where the switching circuit includes two MOSFETs, the turn-OFF transition time is proportional to a discharge time of MOSFET gate capacitance of the MOSFETs. It will be appreciated by those persons skilled in the art that MOSFET switching controls drain current using gate voltage. MOSFETs, however, have input and output capacitances which affect the switching time of the MOSFETs. Thus, for instance, when switching to an OFF state, the MOSFET is transitioned through a turn-OFF transition whilst the MOSFET capacitance (in particular, MOSFET gate capacitance) is discharged which occurs over a turn-OFF transition time.

In an embodiment, the switching control circuit includes a transistor Q2 configured to be pulled low to cause discharge of the MOSFETs gate capacitance via a resistor R3 with a selected resistance to select the discharge time of the MOSFET gate capacitance. For example, the resistor R3 is a 22KΩ resistor and the discharge time is 65 μs.

In an embodiment, the dv/dt feedback circuit includes a transistor Q3 to direct said at least some dv/dt feedback current through a capacitor C1 with a selected capacitance to the gate of the MOSFETs when sufficient voltage across a resistor R4 with a selected resistance occurs in the switching control circuit, wherein the at least some dv/dt feedback current alters the rate of change of the discharge of the MOSFETs gate capacitance to reduce the rate of change of the initial region region of the turn-OFF transition profile. For example, the resistor R4 is a 10KΩ resistor and the capacitor C1 is a 100 pF capacitor.

Further, the dv/dt feedback circuit includes an RC network in series with the gate of the MOSFETs so that the at least some dv/dt feedback current is directed through the RC network during the turn-OFF transition. In this embodiment, the RC network includes a capacitor C2 with a selected capacitance and a resistor R6 with a selected resistance so that said at least some dv/dt feedback current initially rises in accordance with an increasing voltage drop across the resistor R6 and the capacitor C2 as the MOSFETs gate capacitance decreases during the turn-OFF transition. Also, said at least some dv/dt feedback current rising causes saturation of the transistor Q3 which subsequently causes exponential decay of the at least some dv/dt feedback current which is applied to the gate of the MOSFETs. For example, the resistor R6 is a 33KΩ resistor and the capacitor C2 is a 1 nF capacitor.

Preferably, the at least some dv/dt feedback current also reduces the rate of change of a final region of the turn-OFF transition profile. More preferably, the at least some dv/dt feedback current influences the initial, intermediate and final regions of the turn-OFF transition profile. Thus, the at least some dv/dt feedback current varies over the initial, intermediate and final regions of the turn-OFF transition profile to achieve the desired turn-OFF transition profile (i.e. drain voltage profile).

In another embodiment, the RC network further includes a resistor R5 to divert a portion of the at least some dv/dt feedback current away from the capacitor C2 to further control the turn-OFF transition profile. For example, the resistor R5 is a 33KΩ resistor.

In another aspect, there is provide a leading edge phase control dimmer circuit for controlling alternating current (AC) power to a load, the circuit including: a switching circuit for controlling delivery of AC power to the load by conducting power to the load in an ON state and not conducting power to the load in an OFF state; and a switching control circuit for controlling turn-OFF and turn-ON of the switching circuit at each cycle of the AC to control switching of the ON and OFF states of the switching circuit, wherein the switching control circuit controlling turn-ON of the switching circuit includes controlling a turn-ON transition of the switching circuit between the OFF state and the ON state of the switching circuit extending for a selected turn-ON transition time, and wherein the switching control circuit further includes a dv/dt feedback circuit for controlling a turn-ON transition profile indicative of a drain voltage of the switching circuit of the turn-ON transition and the selected turn-ON transition time by returning at least some dv/dt feedback current generated by the switching circuit back to the switching circuit, whereby the dv/dt feedback circuit is configured to control said at least some dv/dt feedback current over the turn-ON transition so as to reduce a rate of change of the turn-ON transition profile to minimise harmonics generation by the switching circuit.

BRIEF DESCRIPTION OF DRAWINGS

Embodiments of the invention will now be described, by way of example only, with reference to the accompanying drawings, in which.

DETAILED DESCRIPTION

Figure 1:
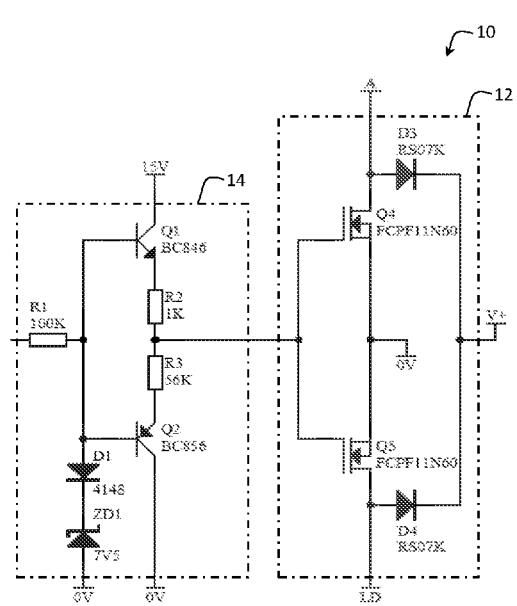
FIG. 1 shows an example of a prior art trailing edge phase control dimmer circuit.
Figure 2:
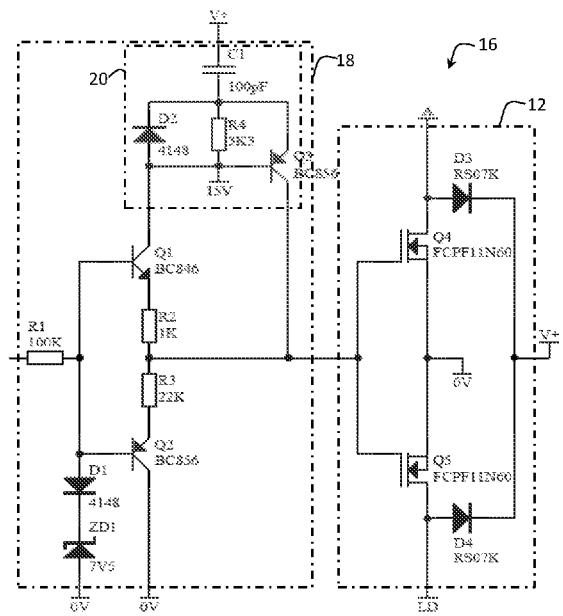
FIG. 2 shows another example of a prior art trailing edge phase control dimmer circuit.
Figure 3:
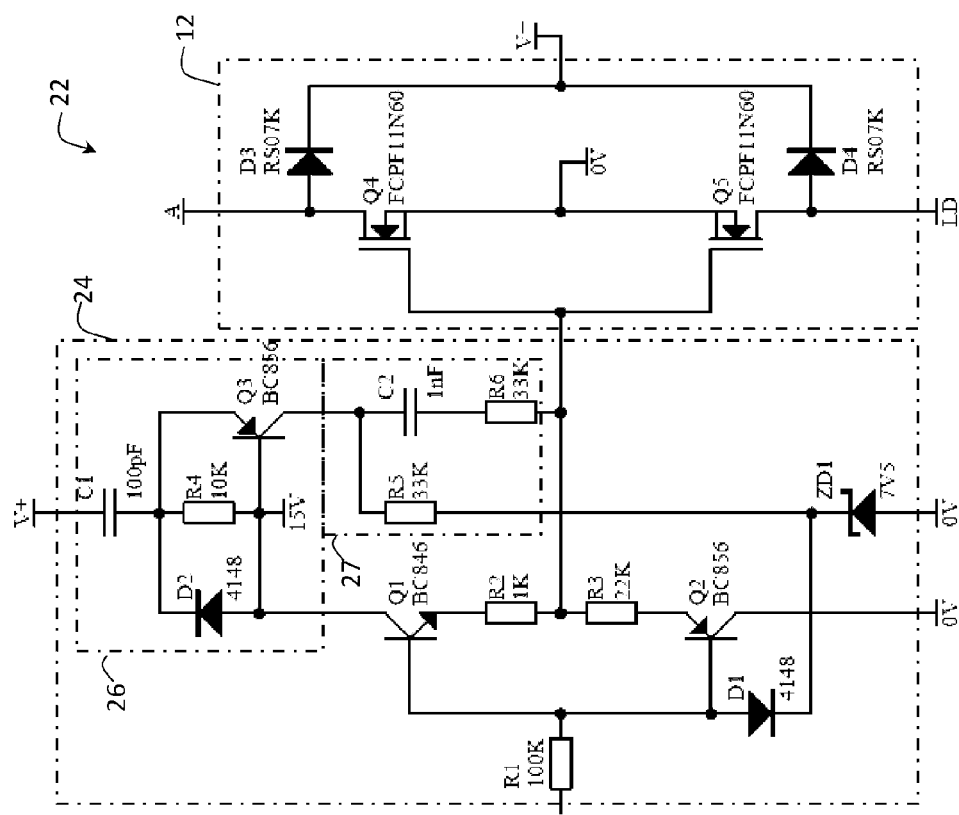
FIG. 3 shows a trailing edge phase control dimmer circuit according to an embodiment of the present invention.

FIG. 3 shows an embodiment of a trailing edge phase control dimmer circuit 22 having a switching circuit 12, a switching control circuit 24 and an enhanced dv/dt control circuit 26. As with the above described exemplary prior art dimmer circuits 10 and 16 shown in FIGS. 1 and 2, the switching circuit 12 includes switching elements Q4 and Q5, which are MOSFET switching devices (e.g. high voltage (600V) N-channel MOSFETs such as a FCPF11N60), which are used to control the amount of AC power delivered to the load. As described, the MOSFETs Q4 and Q5 are configured so that they alternately control power delivery to the load over the different polarity half cycles of AC power. That is, the MOSFETs Q4 and Q5 turn-ON and turn-OFF the switching circuit 12 at each cycle of the AC, respectively, so that the load (e.g. a driver for LED down lights) is dimmed in proportion to the amount of time in each cycle that the switching circuit 12 is switched OFF and not conducting power to the load. In the embodiment, the load is, for instance, a capacitive load in the form of a driver for LED lights.

The switching control circuit 24 of the embodiment shown in FIG. 3 also implements MOSFET gate drive control using transistors Q1 and Q2, as described above. Here, the transistors Q1 and Q2 are also BC856 PNP transistors. Transistor Q1 base drive at resistor R1 input is again pulled high to charge MOSFET gate capacitance of the MOSFETs Q4 and Q5 via resistor R2 to hold the MOSFETs Q4 and Q5 in the ON state condition. In the embodiment, R1 is a 100KΩ resistor and R2 is a 1KΩ resistor. Diode D1 and Zener diode ZD1 are also employed to clamp the MOSFETs Q4 and Q5 ON state gate voltage at a suitable level for proper bias. D1 is again a 4148 high speed diode and ZD1 is a 7V5 Zener diode. Transistor Q2 base drive at R1 input is also pulled low to cause discharge of MOSFET gate capacitance via resistor R3, which is of a value that is selected to provide the desired turn-OFF transition time of the MOSFETs Q4 and Q5 of the switching circuit 12. Here, R3 is selected as a 22KΩ resistor to provide for a relatively fast turn-OFF transition time of the MOSFETs Q4 and Q5.

As with the exemplary prior art circuit of FIG. 2, the switching control circuit 24 is configured to reduce the turn-OFF transition time by selecting a 22KΩ resistor as R3. As shown in the exemplary displays of load current 48 54 in the displays 46 52 showing operation of the prior art circuits, the selection of the 22KΩ resistor, however, resulted in either a sharp (i.e. high rate of change) initial/final turn-OFF region of the turn-OFF transition profile which could result in excessive EMI generating harmonics output or a smoother (i.e. low rate of change) initial/final turn-OFF region of the turn-OFF transition profile but with a long turn-OFF transition time. Specifically, in the exemplary prior art circuit of FIG. 2, the switching control circuit 18 included the dv/dt feedback circuit 20 to attempt to smooth the initial/final turn-OFF region of the turn-OFF transition profile, but the operation of which resulted in an overly long turn-OFF transition time and thus excess power dissipation of the dimmer circuit 16. The embodiment, shown in FIG. 3, employs an enhanced dv/dt control circuit 26 to smooth the initial/final turn-OFF region of the turn-OFF transition profile without overly increasing the turn-OFF transition time.

As with the exemplary circuit shown in FIG. 2, the limiting of MOSFETs Q4 and Q5 drain voltage occurs through action of dv/dt feedback current returned through C1 of the dv/dt control circuit 26. The dv/dt feedback current exceeds that required to generate sufficient voltage across resistor R4 to result in operation of transistor Q3 in directing excess dv/dt feedback current to the MOSFETs Q4 and Q5 gate terminal. In the embodiment of FIG. 3, the transistor Q3 is a BC856 PNP transistor, the capacitor C1 is a 100 pF capacitor, and the resistor R4 is a 10KΩ resistor.

In comparison to the prior art circuit shown in FIG. 2, a considerably larger value for R4 (10KΩ) is selected in the embodiment shown in FIG. 3. Hence, dv/dt feedback current can be applied during the early part of the turn-OFF transition, where dv/dt feedback current starts off relatively low in magnitude, so as to influence the dv/dt feedback current in the initial region of the turn-OFF transition profile. That is, the dv/dt feedback current exceeds that which is required to generate sufficient voltage across R4, to result in operation of Q3, to direct the excess portion of dv/dt feedback current to MOSFETs Q4 and Q5 gate terminal via a series RC network 27 comprising C2 and R6. In addition, resistor R5 is employed to determine the initial voltage condition of C2 prior to MOSFET Q4 and Q5 turn-OFF, and additionally diverts a portion of dv/dt feedback current away from C2 to achieve a desired profile of the initial and final region of the turn-OFF transition profile—that is, having a reduced rate of change of the initial and final region of the turn-OFF transition profile. Thus, the enhanced dv/dt control circuit 26 smoothes the initial and final regions of the turn-OFF transition profile to reduce the generation of EMI causing harmonics by the switching circuit 24.

That is, the applied dv/dt feedback current from the enhanced dv/dt control circuit 26 starts at low level, and rises in accordance with the inherent increase in rate of rise of dv/dt as MOSFET drain-gate capacitance reduces. The applied dv/dt feedback current reaches a maximum—which is attributed to the increasing voltage drop across R6 and C2 eventually causing saturation of Q3. Subsequent to saturation of Q3, C2 voltage however continues to increase, resulting in the exponential decay of dv/dt feedback current applied to MOSFETs Q4 and Q5 gate terminal; hence, avoiding extending the overall turn-OFF transition time. Accordingly, selection of time-constant of R6 and C2 is based on the desired overall turn-OFF transition time. This enables selective adjustment and smoothing of rate of change of drain voltage of the MOSFETs in the initial region of the turn-OFF transition profile, without adversely extended the overall turn-OFF transition time. The selection of resistor and capacitor values in the embodiment hence achieves moderate transition related power dissipation while maintaining acceptable EMI harmonic output. For instance, in the embodiment, R5 is a 33KΩ resistor, R6 is a 33KΩ resistor, and C2 is a 1 nF capacitor.

Figure 5:
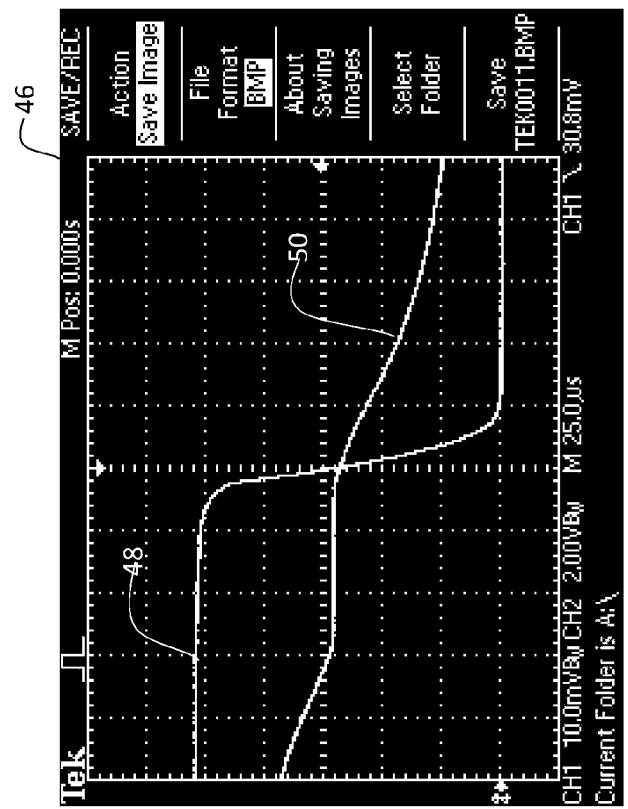
FIG. 5 shows a display of an oscilloscope used in relation to an example of a prior art dimmer circuit.
Figure 4:
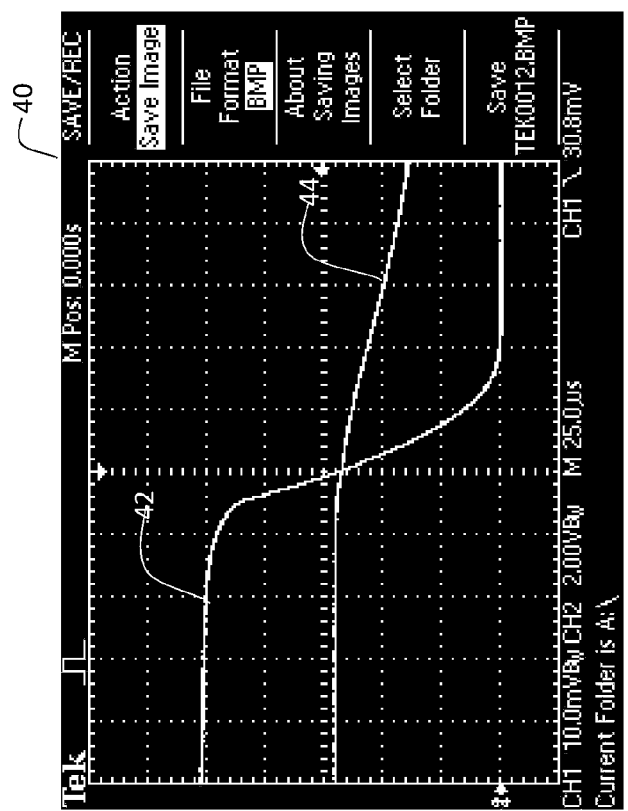
FIG. 4 shows a display of an oscilloscope used in relation to the dimmer circuit of FIG. 1.
Figure 7:
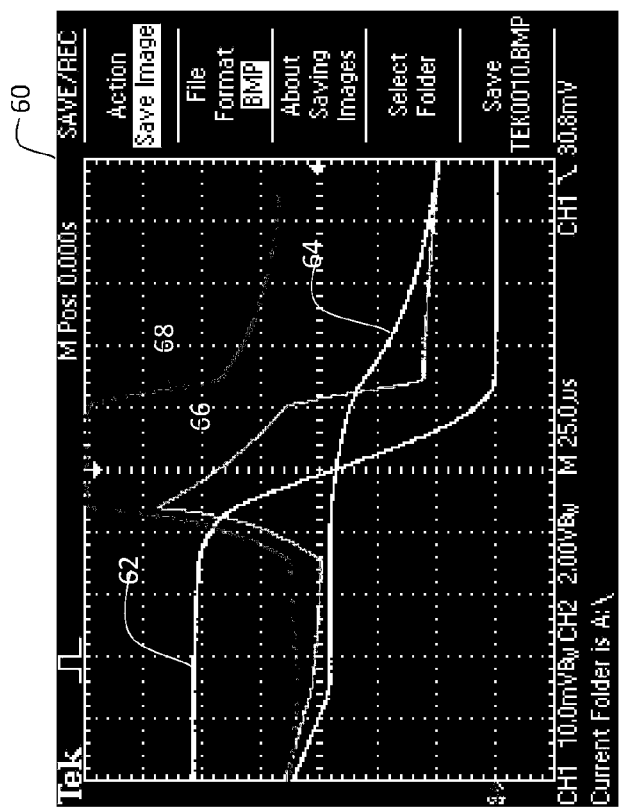
FIG. 7 shows a display of an oscilloscope used in relation to the dimmer circuit of FIG. 3.
Figure 6:
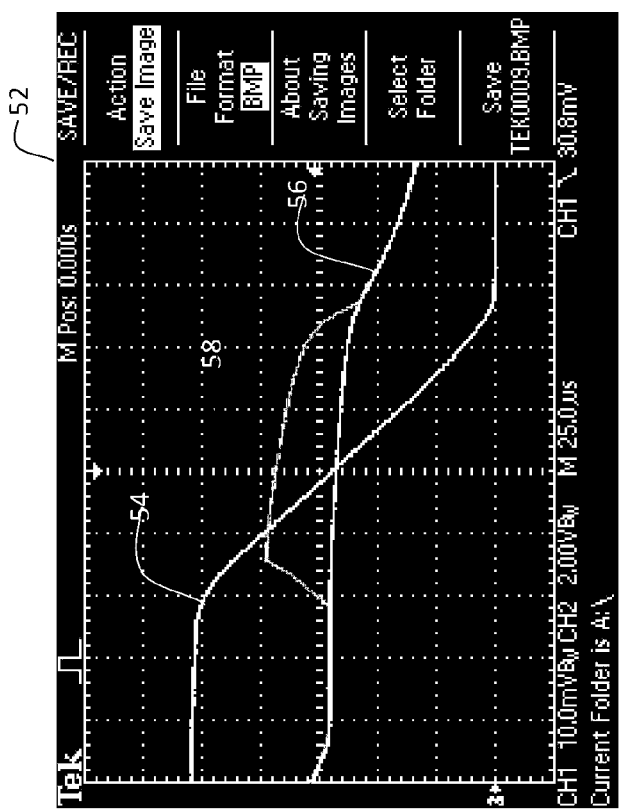
FIG. 6 shows a display of an oscilloscope used in relation to the dimmer circuit of FIG. 2.

The turn-OFF transition profile following deployment of the enhanced dv/dt control circuit 26 is indicated in FIG. 7 in a display 60 of an oscilloscope analysing operation of the embodiment of the dimmer circuit 22. Specifically, the display 60 shows load current 62 with 0.5 A per division indicative of the turn-OFF transition profile, MOSFET Q4 and Q5 gate voltage 64 with 2V per division, dv/dt feedback current 66 with 60 μA per division, and, and Q3 collector voltage 68 with 2V per division. Here, it can be seen, that, the initial and final regions of the turn-OFF transition profile are smoother that those shown in, for example, FIG. 5 whilst the load current 42 is transitioned from the ON to OFF state over a relatively short turn-OFF transition time of approximately 65 μs. As discussed above, the load current 62 of the embodiment is indicative of the MOSFET Q4 and Q5 drain voltage, and thus the turn-OFF transition profile. It can be seen the turn-OFF transition profile, indicated by the load current 62, is influenced over its initial, intermediate (linear), and final regions by the dv/dt feedback current 66. Also, it can be seen from the Q3 collector voltage 68 that the dv/dt feedback current 66 starts to exponentially decay when the transistor Q3 enters saturation mode.

It will be understood that there may be other variations and modifications to the configurations describe here that are also within the scope of the present invention.

The invention claimed is:

1. A trailing edge phase control dimmer circuit for controlling alternating current (AC) power to a load, the circuit including:
a switching circuit for controlling delivery of AC power to the load by conducting power to the load in an ON state and not conducting power to the load in an OFF state; and
a switching control circuit for controlling turn-OFF and turn-ON of the switching circuit at each cycle of the AC to control switching of the ON and OFF states of the switching circuit,
wherein the switching control circuit controlling turn-OFF of the switching circuit includes controlling a turn-OFF transition of the switching circuit between the ON state and the OFF state of the switching circuit extending for a selected turn-OFF transition time,
wherein the switching control circuit further includes a dv/dt feedback circuit for controlling a turn-OFF transition profile indicative of a drain voltage of the switching circuit of the turn-OFF transition and the selected turn-OFF transition time by returning at least some dv/dt feedback current generated by the switching circuit back to the switching circuit, whereby the dv/dt feedback circuit is configured to control said at least some dv/dt feedback current over the turn-OFF transition so as to reduce a rate of change of at least an initial region of the turn-OFF transition profile to minimise harmonics generation by the switching circuit,
wherein the switching circuit includes two MOSFETs to control turn-OFF and turn-ON at each half cycle of the AC respectively, and wherein the switching control circuit provides gate drive control of the MOSFETs to control the turn-OFF transition of the MOSFETs,
wherein the turn-OFF transition time is proportional to a discharge time of MOSFET gate capacitance of the MOSFETs,
wherein the switching control circuit includes a transistor Q2 configured to be pulled low to cause discharge of the MOSFETs gate capacitance via a resistor R3 with a selected resistance to select the discharge time of the MOSFET gate capacitance,
wherein the dv/dt feedback circuit includes a transistor Q3 to direct said at least some dv/dt feedback current through a capacitor C1 with a selected capacitance to the gate of the MOSFETs when sufficient voltage across a resistor R4 with a selected resistance occurs in the switching control circuit, wherein the at least some dv/dt feedback current alters the rate of change of the discharge of the MOSFETs gate capacitance to reduce the rate of change of at least the initial region of the turn-OFF profile,
and, wherein the dv/dt feedback circuit further includes an RC network in series with the gate of the MOSFETs so that the at least some dv/dt feedback current is directed through the RC network during the turn-OFF transition.

2. A trailing edge dimmer circuit as claimed in claim 1, wherein the RC network includes a capacitor C2 with a selected capacitance and a resistor R6 with a selected resistance so that said at least some dv/dt feedback current initially rises in accordance with an increasing voltage drop across the resistor R6 and the capacitor C2 as the MOSFETs gate capacitance decreases during the turn-OFF transition.

3. A trailing edge dimmer circuit as claimed in claim 2, wherein said at least some dv/dt feedback current rising causes saturation of the transistor Q3 which subsequently causes exponential decay of the at least some dv/dt feedback current which is applied to the gate of the MOSFETs.

4. A trailing edge dimmer circuit as claimed in claim 2, wherein the resistor R6 is a 33KΩ resistor and the capacitor C2 is a 1 nF capacitor.

5. A trailing edge dimmer circuit as claimed in claim 1, wherein the RC network further includes a resistor R5 to divert a portion of the at least some dv/dt feedback current away from the capacitor C2 to further control the turn-OFF transition profile.

6. A trailing edge dimmer circuit as claimed in claim 5, wherein the resistor R5 is a 33KΩ resistor.

7. A trailing edge phase control dimmer circuit for controlling alternating current (AC) power to a load, the circuit including:
a switching circuit for controlling delivery of AC power to the load by conducting power to the load in an ON state and not conducting power to the load in an OFF state; and
a switching control circuit for controlling turn-OFF and turn-ON of the switching circuit at each cycle of the AC to contNewrol switching of the ON and OFF states of the switching circuit,
wherein the switching control circuit controlling turn-OFF of the switching circuit includes controlling a turn-OFF transition of the switching circuit between the ON state and the OFF state of the switching circuit extending for a selected turn-OFF transition time,
wherein the switching control circuit further includes a dv/dt feedback circuit for controlling a turn-OFF transition profile indicative of a drain voltage of the switching circuit of the turn-OFF transition and the selected turn-OFF transition time by returning at least some dv/dt feedback current generated by the switching circuit back to the switching circuit,
and wherein the dv/dt feedback circuit further includes an RC network in series with the gate of the MOSFETs so that the at least some dv/dt feedback current is directed through the RC network during the turn-OFF transition.

8. A trailing edge dimmer circuit as claimed in claim 7, wherein the RC network includes a RC capacitor with a selected capacitance and a RC resistor with a selected resistance so that said at least some dv/dt feedback current initially rises in accordance with an increasing voltage drop across the RC resistor and the RC capacitor as the MOSFETs gate capacitance decreases during the turn-OFF transition.

9. A trailing edge dimmer circuit as claimed in claim 8, wherein the RC resistor is a 33KΩ resistor and the capacitor is a 1 nF capacitor.

10. A trailing edge dimmer circuit as claimed in claim 7, wherein the RC network further includes a diverter resistor to divert a portion of the at least some dv/dt feedback current away from the RC capacitor to further control the turn-OFF transition profile.

11. A trailing edge dimmer circuit as claimed in claim 10, wherein the diverter resistor R5 is a 33KΩ resistor.

* * * * *